United States Patent
Kinoshita

[11] Patent Number: 6,091,156
[45] Date of Patent: *Jul. 18, 2000

[54] SEMICONDUCTOR PELLET HAVING PLURAL CHIPS

[75] Inventor: Masaaki Kinoshita, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/920,905

[22] Filed: Aug. 29, 1997

[30] Foreign Application Priority Data

Sep. 2, 1996 [JP] Japan .................................. 8-232357

[51] Int. Cl.[7] .................................................. H01L 23/48
[52] U.S. Cl. ............................................. 257/786; 257/723
[58] Field of Search ................................ 257/723, 786, 257/686, 620

[56] References Cited

U.S. PATENT DOCUMENTS

| | | | |
|---|---|---|---|
| 5,153,507 | 10/1992 | Fong et al. | 324/158 R |
| 5,616,931 | 4/1997 | Nakamura et al. | 257/48 |

FOREIGN PATENT DOCUMENTS

| | | | |
|---|---|---|---|
| 55-130137 | 10/1980 | Japan | 257/786 |
| 59-43823 | 10/1984 | Japan . | |
| 61-63842 | 4/1986 | Japan . | |
| 62-72155 | 4/1987 | Japan . | |
| 3-22456 | 1/1991 | Japan | 257/786 |
| 3-214764 | 9/1991 | Japan . | |
| 4-155855 | 5/1992 | Japan | 257/786 |
| 6-37157 | 2/1994 | Japan | 257/786 |
| 8-51159 | 2/1996 | Japan . | |

Primary Examiner—Wael Fahmy
Assistant Examiner—Roy Potter
Attorney, Agent, or Firm—Young & Thompson

[57] ABSTRACT

A semiconductor pellet comprising first and second semiconductor chips being diced from a wafer, a first bonding-pad formed at a first peripheral portion of said first chip, and a second bonding-pad formed at second peripheral portion of said second chip, which bonding-pads are arranged so as to keep symmetry after rotating around the central point of said pellet by 180 degrees. Judging whether the first chip is good or not and if the chip is not good, then the pellet is rotated around the central point thereof by 180 degrees, and it is mounted onto a chip carrier. Then wire-bonding is conducted.

7 Claims, 6 Drawing Sheets

SEMICONDUCTOR PELLET HAVING PLURAL CHIPS

BACKGROUND OF THE INVENTION

1. Field of the Invention

The present invention relates to a semiconductor device, and more particularly to a semiconductor pellet that has a plurality of chips, and also relates to a method for assembling the semiconductor devices.

2. Description of the Prior Art

Since a semiconductor device is limited in its high speed operation because of its delay in conductive lines, it is often necessary that a device's length-to-width ratio of chip is decreased to obtain its high speed operation in spite of fabrication difficulties. For a semiconductor device with a large length-to-width ratio of, for example, 10:2, it is difficult to dice, and such a device could also be damaged during fabrication processes after dicing, because it is impossible to hold itself, at its large length-to-width ratio. In assembling and wire-bonding processes, this device could also be damaged for the same reason. If the device is molded with resin, its substrate warps and its passivation film cracks due to both heat and stress. It also occurs that the device is made less moisture-proof from substrate cracking. All of these factors cause a remarkable decrease in fabrication yield of the device.

It has been known that if length-to-width ratio is set less than about 3:1, then it is possible to avoid the above mentioned problems because of the experience gotten through so many fabrications of semiconductor devices so far. However, it is difficult to handle the semiconductor devices, if their chip areas are too small. So it is necessary to keep somewhat large areas of the devices to promote the increase in their handling capabilities.

In view of handling capability, a chip with a large area takes an advantage of small area, as mentioned above. However, in view of high speed operation, the chip with a small area takes an advantage of large area, because the former can decrease delays in conductive lines. Thus there is a dilemma between chips with large and small areas. So it is advantageous to fabricate a semiconductor device that has a large handling area even with a small circuit area. One way to realize this point is a method of grouping a plurality of semiconductor devices into a pellet; mounting the pellet on a chip carrier; and wire-bonding only a part thereof. For this purpose, it is necessary to fabricate a variety of integrated circuits in a semiconductor wafer.

It is, however, difficult to fabricate simultaneously a variety of integrated circuits in a small amount. A technique to overcome this difficulty is proposed in the Japanese laid-open patent publication No. 62-72155. The proposed technique provides a method for fabricating integrated circuits (chips) as follows: making a pellet pattern that a variety of chip patterns are grouped; making a photo-mask that has repeated pellet patterns; making a wafer by using the photo-mask in photolithography process; and dicing pellets from the wafer so as to locate a chip that has a predetermined function or characteristic at predetermined corner of a chip carrier. Because this technique groups a variety of chip patterns into a pallet pattern, the process lines can fabricate a variety of chips at all times. So the proposed technique makes it possible to fabricate simultaneously a variety of integrated circuits in a small amount, besides in low cost.

FIG. 1, FIG. 2, and FIG. 3 are schematic views of the above mentioned technique. In FIG. 1, four kinds of the integrated circuits (chips), called A, B, C, and D, are grouped into a pellet 1. On the other hand, electrically conductive leads are formed at the bottom and side of a chip carrier for the pellet 1. Now the chip A has predetermined function, so the chip A is located at the bottom of the left side of the pellet 1.

If the chip D has a predetermined function, the chip D is located at the bottom of the left side of the pellet 1 as shown in FIG. 2. Assuming that the pellet 1 is identical in both FIG. 1 and FIG. 2 and if pellet shown in FIG. 1 turns around the central point thereof by 180 degrees, the pellet shown in FIG. 2 can be obtained. Any pellet of both FIG. 1 and FIG. 2 can be obtained by dicing a pellet from a wafer by locating the chip that has a predetermined function at the bottom of the left side of the pellet 1.

After pellets have been diced, wire-bonding is conducted. FIG. 3 shows wire-bonding process for the pellet shown in FIG. 1. Electrically conductive leads 5 are formed at the bottom and left side of a chip carrier for the pellet 1. Each chip has bonding-pads 7 at the position corresponding to the leads 5. The electrically conductive leads 5 and the bonding-pads 7 are interconnected with bonding-wires 11.

As shown in FIG. 3, the chip A that has a predetermined function is mounted at the bottom of the left side of the chip carrier, and electrically conductive leads 5 are formed at the bottom and the left side of the chip carrier. So it is possible to shorten bonding-wires 11 interconnecting between the chip A and leads 5. This makes it easy to fabricate devices and to promote the increase in their speed of operation.

As mentioned above, the proposed technique is a method that wire-bonding is conducted between a chip carrier and only a chip that is selected among the grouped chips which form a pellet. For example, in FIG. 3, wire-bonding is conducted only between a chip carrier and the chip A that has predetermined function, whilst and other chips B, C, and D are not wire-bonded, which form a pellet with the chip A and support it mechanically. A pellet has larger area than that of each chip, so the pellet is strong and easy to handle.

The proposed technique, however, has not only the advantages mentioned above, but also disadvantages like this: only one chip is used among the pellet which has a plurality of usable chips. For example, only the chip A is used while the others, B, C, and D are not used in FIG. 3. If the chip A is no good, the pellet is also no good although one of other chips B, C, and D is good. This causes a decrease in fabrication yield of the pellet. Since bonding-pads 7 are positioned at the fixed portion of the chip according to leads 5 of the chip carrier, only one chip can be wire-bonded. Therefore none of good chips B, C, and D can be used instead of the bad chip A in FIG. 1.

SUMMARY OF THE INVENTION

The present invention has made in view of overcoming the above mentioned disadvantage inherent in the prior art. Accordingly, it is an object of the present invention to provide a semiconductor pellet having plural chips, which make it easy to handle a chip that has a large length-to-width ratio or a small area.

It is another object of the present invention to provide a semiconductor pellet having plural chips, which can promote device reliability including strength, moisture-proof, and anti-cracking ability of cover-coating.

It is still another object of the present invention to provide a semiconductor pellet having plural chips, which can increase fabrication yield so that any good chip may be usable as the wire-bonding is enabled instead of a bad chip in the same pellet.

BRIEF DESCRIPTION OF THE DRAWINGS

Preferred embodiments of the present invention will be described in detail with reference to the accompanying drawings.

EMBODIMENTS

Figure 1:
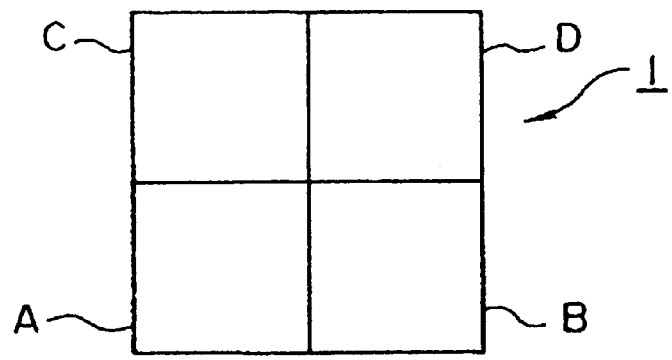
FIG. 1 is a schematic view of the conventional semiconductor pellet according to the prior art.
Figure 2:
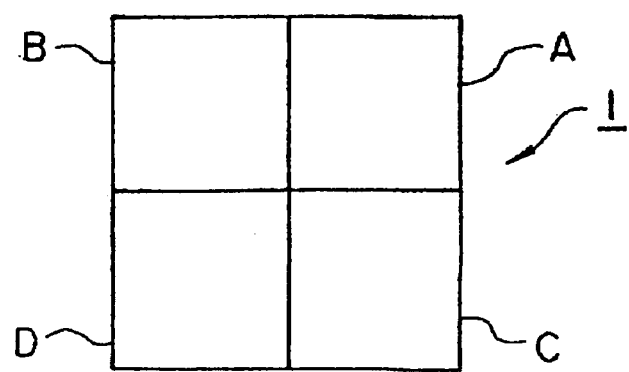
FIG. 2 is another schematic view of the conventional semiconductor pellet according to the prior art.
Figure 3:
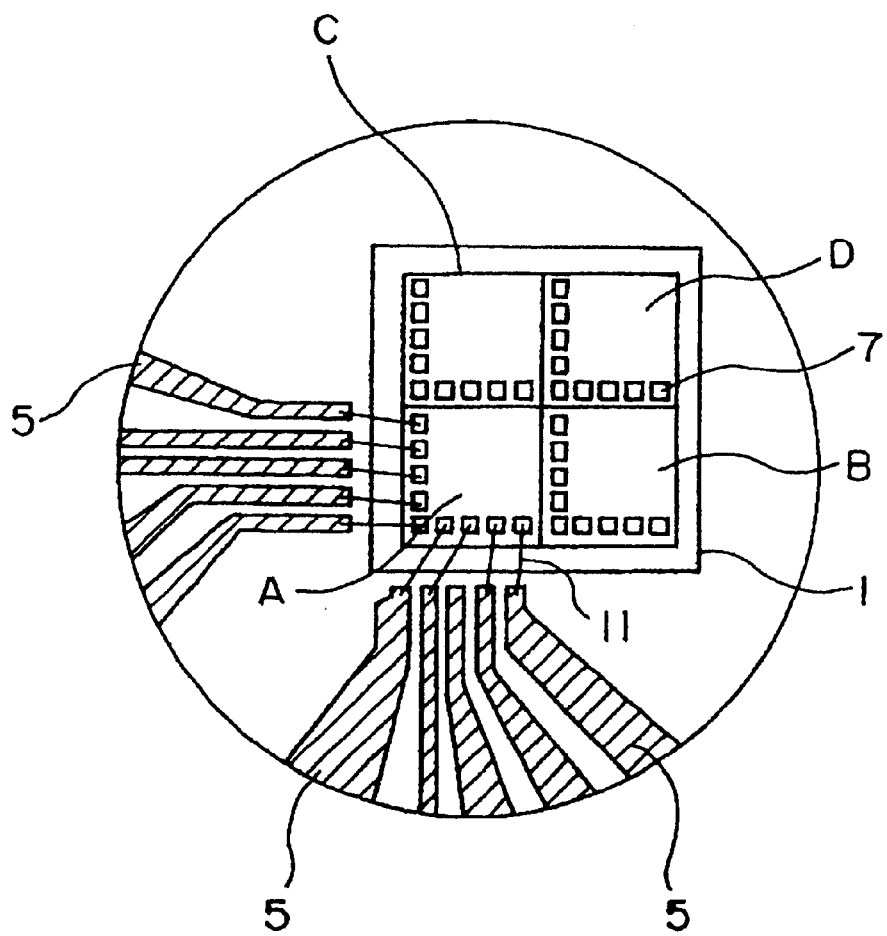
FIG. 3 is a schematic view of the conventional wire-bonding process in the prior art.
Figure 4:
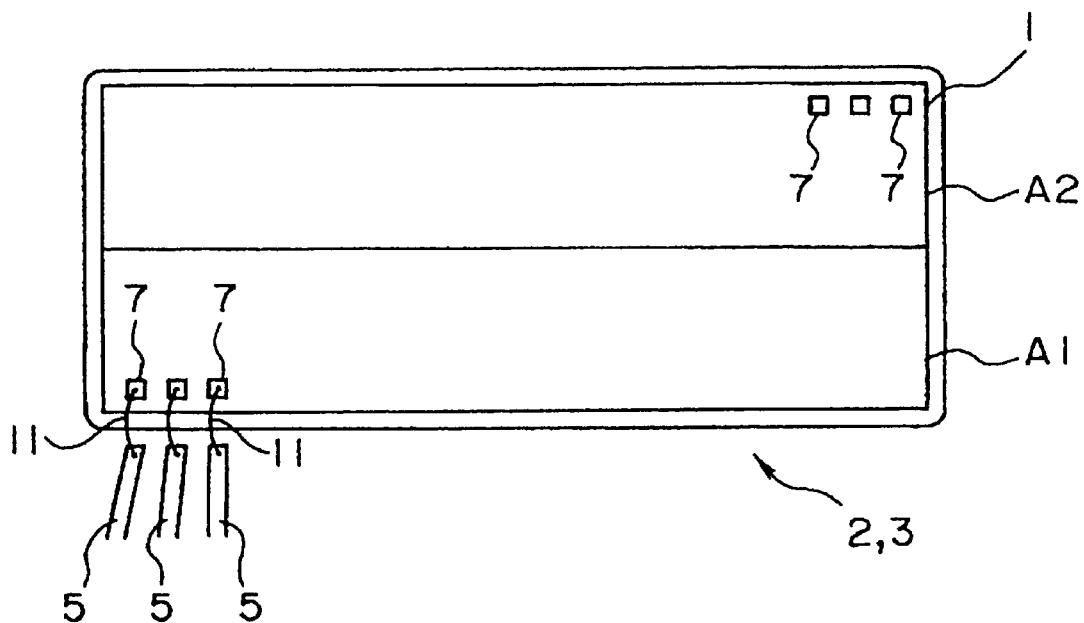
FIG. 4 is a schematic view of a novel semiconductor pellet according to the present invention.

A first embodiment according to the present invention will be described with reference to the accompanying drawings. FIG. 4 is a schematic view of a semiconductor pellet according to the present invention. A pellet 1 illustrated in FIG. 4 has two chips A1 and A2 (an upper chip A1 and a lower chip A2): both having the same function and characteristic. The pellet 1 has been diced as a group of the chips A1 and A2. The two chips A1 and A2 are located so as to keep symmetry after rotation around the central point of the pellet 1 by 180 degrees. The pellet 1 has been mounted on a chip carrier 3 on which an electrical circuit 2 is printed. A chip carrier is also called a package. Bonding-pads 7 of the chips A1 and A2 are arranged at the peripheral portion of the pellet 1. The bonding-pads 7 of the chip A1 are electrically connected to leads 5 formed on the chip carrier 3 with bonding-wires 11.

Figure 5:
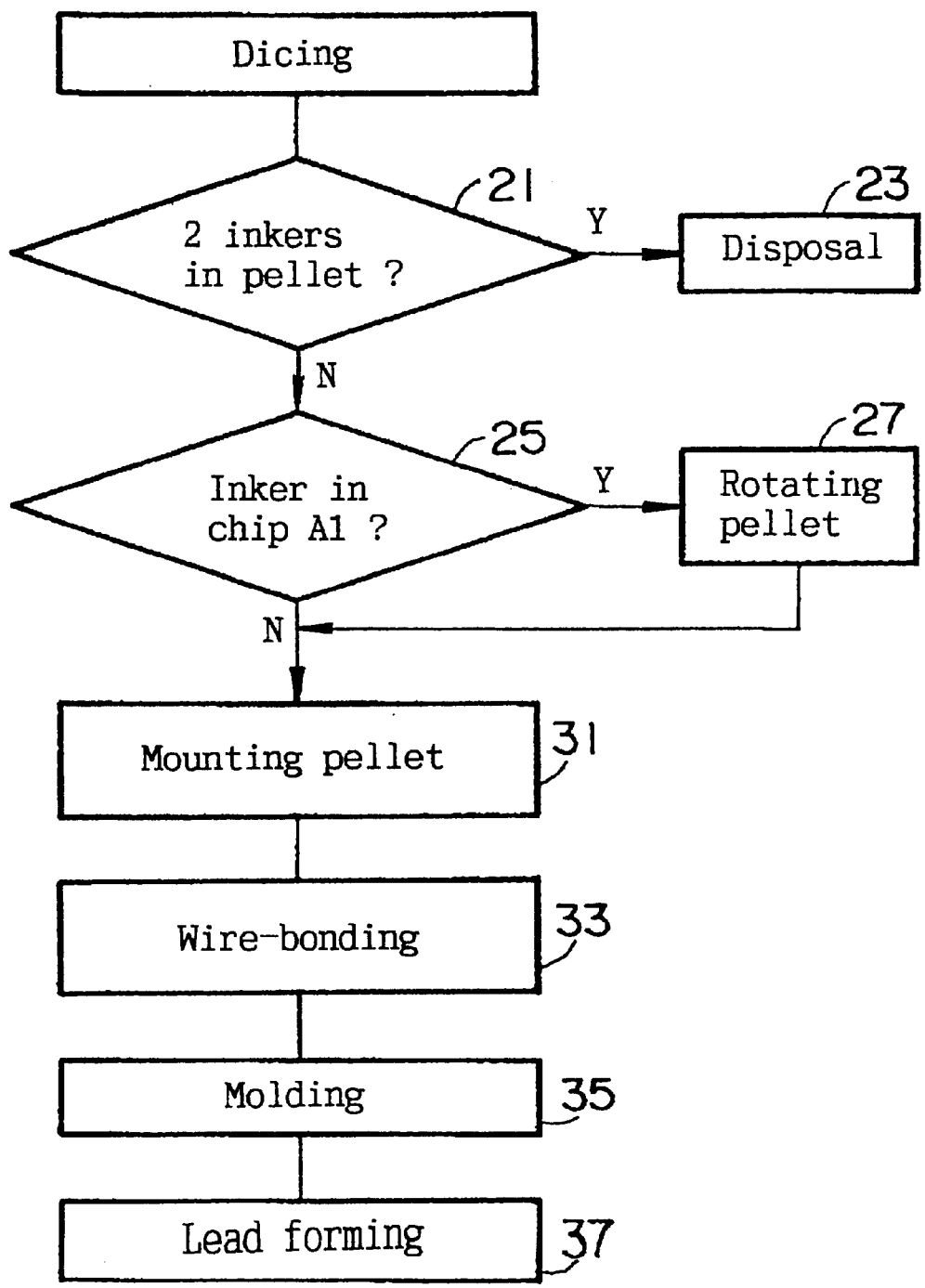
FIG. 5 is a flow-chart showing assembling processes.

The semiconductor device shown in FIG. 4 is assembled in accordance with a flow-chart shown in FIG. 5 that covers from dicing to outer-lead forming. First, the chips A1 and A2 are arranged so as to keep symmetry after rotating around the central point of the pellet 1. This arrangement is conducted by patterning the pellet 1 through wafer processes including photolithography and etching. The pellet 1 is diced so as to bonding-pads 7 of the chips A1 and A2 are arranged at the peripheral portion of the pellet 1.

Next, the chips A1 and A2 are tested on the pellet 1 for their goodness check. This goodness check is the same check as usual both in sight and in operation. If a chip is no good as a result of the check, then "inker" is stamped on the chip so as to make it easy to distinguish no good ones from good ones.

In step 21, it is judged whether inkers exist on both the chips A1 and A2 or not. If answer is "yes", then the pellet including those no good chips cannot be used, so it will be disposed as in step 23. If answer is "no", then it is judged whether inker exists on the chips A1 or not as shown at step 25. If answer is "no", then the chip A1 is good, so the pellet 1 can be used just as it is. If answer is "yes", then the chip A1 is no good, so the pellet 1 will be rotated around the central point thereof by 180 degrees as shown at step 27.

In step 31, both pellets that have no inker and have rotated are mounted on an island of the chip carrier 3. Then wire-bonding is conducted between bonding-pads 7 and leads 5 with bonding-wires 11 as in step 33. After wire-bonding, molding and outer-lead forming process are conducted respectively as shown at steps 35 and 37.

TABLE 1

|  | Ex. 1 | Prior Art | Present Invention |
|---|---|---|---|
| 2-Chip-Goodness | 30[%] | 30[%] | 30[%] |
| 1-Chip-Goodness | 40[%] | 0–40[%] | 30[%] |
| 0-Chip-Goodness | 40[%] | 0[%] | 0[%] |
| Wafer Yield | 50[%] | 30–70[%] | 70[%] |

Tables 1 and 2 show advantages of the semiconductor devices according to the present embodiment. Table 1 shows goodness ratios under chip conditions that a wafer has 30% two-chip-goodness, 40% one-chip-goodness, and 40% zero-chip-goodness after dicing into pellets each of which has two chips. If a pellet has two good chips, then the pellet is usuable. If a pellet has one good chip, then the pellet is usable in half. If a pellet has no good chips, then the pellet is not usable at all. Calculating wafer yield in this case, the result is as follows: 30[%]*1+40[%]*(½)+30[%]*0=50[%]. In this condition, real wafer yield of a semiconductor device having two chips is 30–70[%] for the prior art, because possibility that one-chip-goodness pellet become usable is varying among 0–40[%]. On the other hand, 70[%] real wafer yield is available for the present embodiment, because possibility that one-chip-goodness pellet becomes usable is 40[%], not varying, then wafer yield is as follows: 30[%]*1+40[%]*1+30[%]*0=70[%]. Thus the present embodiment can improve wafer yield.

TABLE 2

|  | Ex. 2 | Prior Art | Present Invention |
|---|---|---|---|
| 2-Chip-Goodness | 0[%] | 0[%] | 0[%] |
| 1-Chip-Goodness | 100[%] | 0–100[%] | 100[%] |
| 0-Chip-Goodness | 0[%] | 0[%] | 0[%] |
| Wafer Yield | 50[%] | 0–100[%] | 100[%] |

Table 2 shows goodness ratios under chip conditions that a wafer has 0% two-chip-goodness, 100% one-chip-goodness, and 0% zero-chip-goodness after dicing into pellets each of which has two chips. If a pellet has one good chip, then the pellet is usable in half. If a pellet has no good chips, then the pellet is not usable at all. Calculating wafer yield, the result is as follows: 0[%]*0+100[%]*(½)+0[%]*0=50[%]. Under this condition, real wafer yield is 0–100[%] for the prior art, because of a possibility that one-chip-goodness pellet becomes usable is varying among 0–100[%]. On the other hand, 100[%] is available for the present embodiment, because possibility that one-chip-goodness-pellet become usable is 100[%], not varying, then real wafer yield is as follows: 0[%]*0+100[%]*1+0[%]*0=100[%]. Thus the present embodiment can also improve real wafer yield.

Tables 1 and 2 show advantages of an embodiment according to the present invention. These advantages are achieved particularly in cases as follows: up to 50% chip-goodness available because of high density of integrated circuits; substantially low yield because of state-of-the-art process technology; low yield because of failure of building process lines.

Figure 6:
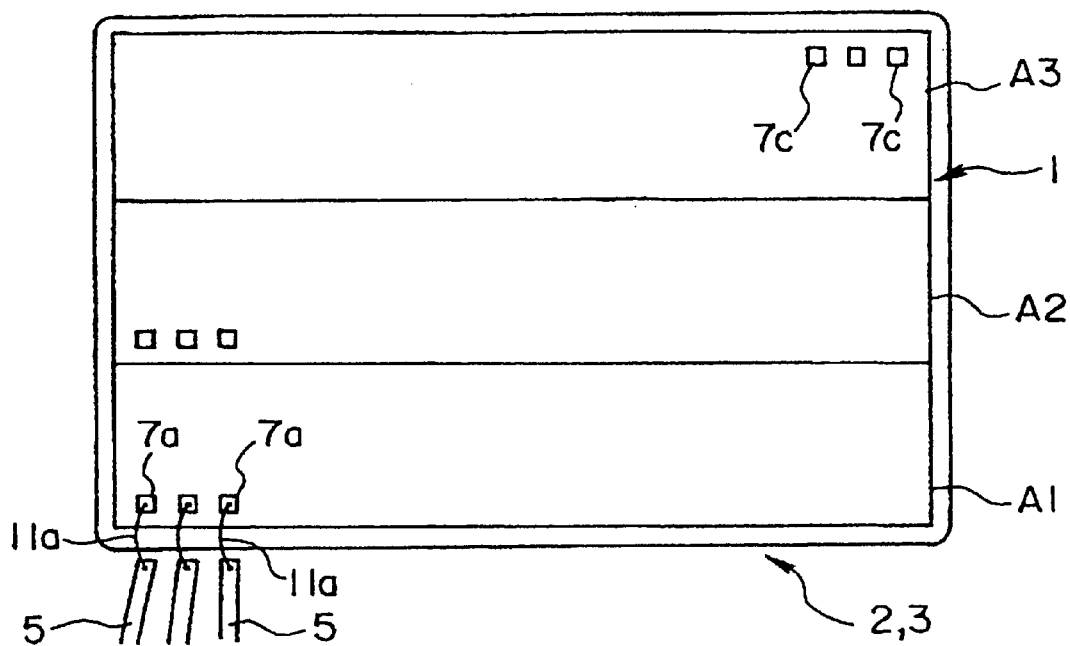
FIG. 6 is a schematic view of a semiconductor pellet of a second embodiment according to the present invention.

FIG. 6 is a schematic view of a second embodiment according to present invention. In FIG. 6; a pellet 1 that has three chips A1, A2, and A3 is mounted on a chip carrier 3 on which a printed circuit 2 is formed. A1 is a lower chip with respect to A2 and A3, while A3 is an upper chip with respect to A1 and A2. Three chips A1, A2, and A3 are arranged so as to minimize length-to-width ratio of the pellet 1. For example, if each chip has length-to-width ratio of 1:4, then it is difficult to handle the chip. The three chips A1, A2, and A3 are arranged as shown in FIG. 6, then length-to-width ratio of the pellet 1 is 3:4, so it is easy to handle the pellet 1. Bonding-pads 7a and 7c of the chips A1 and A3 are arranged respectively at the peripheral portions of the pellet 1.

The semiconductor device shown in FIG. 6 is assembled as follows. The chip A2 arranged between the chips A1 and A3 in a direction. First, the chips A1, A2, and A3 are arranged so as to keep symmetry after rotating around the central point of the pellet 1. This arrangement is conducted by patterning the pellet 1 through wafer processes including photolithography and etching. The pellet 1 is diced so as to bonding-pads 7a and 7c of the chips A1 and A3 arranged at the peripheral portion of the pellet 1.

Next, the chips A1 and A3 are tested on the pellet 1 for their goodness check which is the same as in the embodiment mentioned above. If a chip is no good as a result of the check, then "inker" is stamped on the chip so as to make it easy to distinguish no good ones from good ones.

It is judged whether inker exists on the chips A1 or not. If answer is "no", then the chip A1 is good. Thus the pellet 1 can be used just as it is, and it is mounted onto a chip carrier 3. Then, the wire-bonding is conducted between bonding-pads 7a and leads 5 with bonding-wires 11a as shown in FIG. 6. After wire-bonding, molding and outer-lead forming processes are conducted, and a target semiconductor device is completed.

If answer is "yes" as a result of judgment whether inker exists on the chips A1 or not, then the chip A1 is no good. Thus the pellet 1 will be rotated around the central point thereof by 180 degrees. Subsequently the pellet 1 is mounted onto a chip carrier 3 so that the bonding-pads 7c of the chip A3 may face the lead 5.

As mentioned above, the pellet of the second embodiment has three chips that are diced as a whole from a wafer. In this point, the second embodiment differs from the first embodiment reffering to a pellet having two chips. However, subsequent processes are the same as in the first embodiment, then the second embodiment enables to obtain as many good semiconductor devices as the first embodiment.

Figure 7:
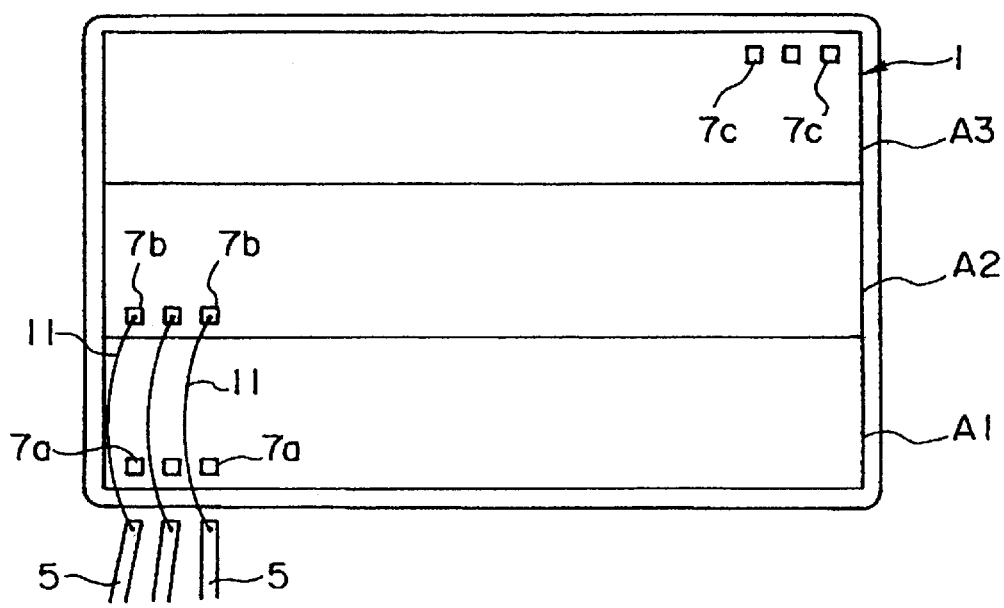
FIG. 7 is a schematic view of a semiconductor pellet of a third embodiment according to the present invention.

FIG. 7 is a schematic view of the third embodiment according to present invention. In FIG. 7, a pellet 1 that has three chips A1, A2, and A3 is mounted on a chip carrier. Three chips A1, A2, and A3 are arranged so as to minimize length-to-width ratio of the pellet 1, as well as the second embodiment. In the third embodiment, however, bonding-pads 7b are formed at bottom of left side of the chip A2. If, therefore, answer is "yes" as a result of judgment whether inkers exist on the chip A1 and A3 or not, then the chips A1 and A3 are no good. In this case, if the chip A2 is good, then wire-bonding is conducted between bonding-pads 7b of the pellet A2 and leads 5 with bonding-wires 11 beyond the chip A1. As a result, the pellet 1 can be used in spite of no good chip A1, though it is necessary to change assembling conditions because of change of bonding-pads position.

Figure 8:
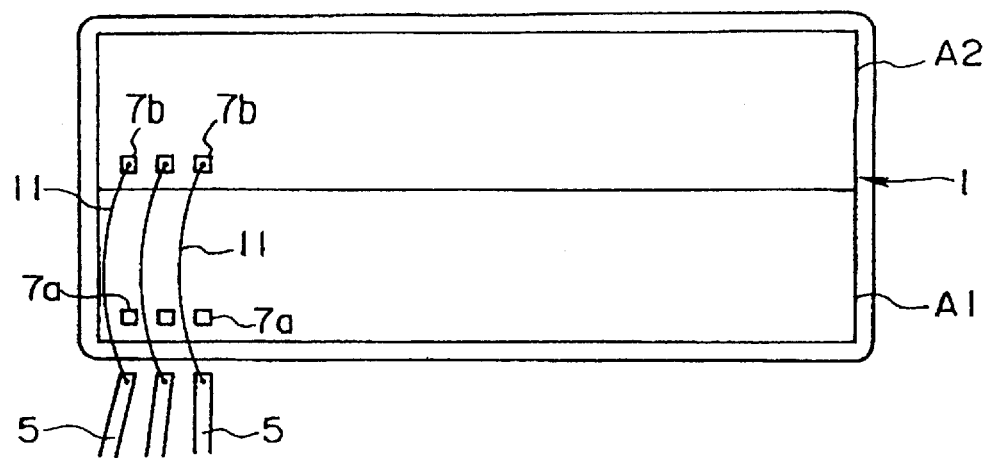
FIG. 8 is a schematic view of a semiconductor pellet of a fourth embodiment according to the present invention.

FIG. 8 is a schematic view of the fourth embodiment according to present invention. In FIG. 8, a pellet 1 that has two chips A1 and A2 which are arranged as well as the first embodiment. In this embodiment, however, bonding-pads 7b are formed at bottom of left side of the chip A2. In this case, if the chip A2 is good instead of the chip A1, then wire-bonding is conducted between bonding-pads 7b of the chip A2 and leads 5 with bonding-wires 11. As a result, the pellet 1 can be used in spite of the no good chip A1, though it is necessary to change assembling conditions because of change of bonding-pads position as well as in the third embodiment.

As mentioned above, the present invention makes it possible to use a pellet that it is difficult to handle for its small area and/or its large length-to-width ratio in spite of no good chip. For that reason, it is possible to select a good chip from chips of a pellet, which are the same function and characteristic, and to wire-bond between the chip and leads formed on a chip carrier. Therefore, the present invention promotes yield of semiconductor devices having a plural chip.

What is claimed is:

1. A mounted semiconductor pellet comprising:

a pellet comprising a plurality of duplicate semiconductor chips diced from a wafer, said plural duplicate semiconductor chips comprising at least an upper semiconductor chip and a lower semiconductor chip, each of said plural semiconductor chips comprising a set of bonding-pads, a first of said sets of bonding-pads being associated with said lower semiconductor chip and a second of said sets of bonding-pads being associated with said upper semiconductor chip, said first and second sets of bonding-pads being formed at first and second peripheral portions of said lower semiconductor chip and said upper semiconductor chip respectively along a peripheral portion of said pellet;

said pellet being mounted on a chip carrier; and said first set and second sets of bonding-pads being arranged so as to keep symmetry around a central point of said pellet, wherein said first and second sets of bonding-pads are located radially opposite each other about the central point, and wherein one of said sets of bonding-pads are electrically connected to said chip carrier and remaining said sets of bonding-pads are free of electrical connection to said chip carrier.

2. A semiconductor pellet of claim 1, wherein said semiconductor pellet further comprises:

a third semiconductor chip being located between said upper and lower semiconductor chips; and a third set of bonding-pads formed at a portion of said third semiconductor chip, said portion corresponding to said first peripheral portion of said lower semiconductor chip.

3. A semiconductor device comprising:

a pellet comprising plural duplicate semiconductor chips diced from a wafer along a perimeter of said pellet, said plural semiconductor chips comprising at least an upper semiconductor chip and a lower semiconductor chip, bonding pads formed at peripheral edge portions of said upper and lower semiconductor chips, said bonding-pads being arranged so as to keep symmetry around a central point of said pellet by 180 degrees; and a chip carrier with conductive leads connected with said bonding pads of one of said plural semiconductor chips, said bonding pads of the other of said plural semiconductor chips being free of connection with any conductive lead, wherein said first and second sets of bonding-pads are located radially opposite each other about the central point.

4. The semiconductor device of claim 3, wherein said bonding pads are formed at upper and lower peripheral edge portions of said pellet, said bonding pads being located to mirror each other about a line drawn intermediate to said bonding pads.

5. The semiconductor device of claim 3, said plural semiconductor chips further comprising an intermediate semiconductor chip, said intermediate semiconductor chips being a duplicate of said upper and lower semiconductor chips; and said intermediate semiconductor chip comprising bonding pads formed on a peripheral edge portion of said intermediate semiconductor chip in positions aligned with said bonding pads of said lower semiconductor chip.

6. The semiconductor chip of claim 5, wherein conductive leads connect with said bonding pads of said intermediate semiconductor chip, said bonding pads of said upper and lower semiconductor chips being free of connection with any conductive leads.

7. The semiconductor chip of claim 3, wherein said bonding pads formed on said peripheral edge portion of said upper semiconductor chip are located above said bonding pads of said lower semiconductor chip and extend inwardly from an edge of said pellet.

* * * * *